METHOD OF MAKING FIELD-EFFECT DEVICE WITH INSULATED GATE

Filed Dec. 26, 1967 2 Sheets-Sheet 1

Gordon A. Shifrin,
Robert W. Bower,
INVENTORS.
BY.
W. Thurston Allister Jr.
ATTORNEY.

Gordon A. Shifrin,
Robert W. Bower,
INVENTORS.
BY.
W. Hess Allister Jr
ATTORNEY.

United States Patent Office 3,514,844
Patented June 2, 1970

3,514,844

METHOD OF MAKING FIELD-EFFECT DEVICE WITH INSULATED GATE

Robert W. Bower, Palos Verdes, and Gordon A. Shifrin, Malibu, Calif., assignors to Hughes Aircraft Company, Culver City, Calif., a corporation of Delaware Filed Dec. 26, 1967, Ser. No. 693,414
Int. Cl. H01l *11/14*
U.S. Cl. 29—571 6 Claims

ABSTRACT OF THE DISCLOSURE

Method of making field-effect devices wherein the source and drain regions or extensions of such regions already formed are provided by coating the surface of a semiconductor body adjacent a metal gate thereon with a dopant material and then bombarding this dopant layer with inert ions to drive the dopant atoms into the semiconductor except where the gate masks the body from the inert ion bombardment.

This invention relates to methods for making semiconductor devices and especially transistor devices wherein the conductivity of a relatively shallow region in a semiconductor body is modulated by means of an electric field. More particularly, the invention relates to methods for fabricating transistor structures of the type known as insulated-gate field-effect transistors.

Operation of transistors of the type to which the present invention appertains is based upon the control of the conductivity of a conduction channel in semiconductor body which channel is induced by an electric field established therein by an insulated control gate as well as by surface charges which may be ionic in nature. Transistors of this type are usually formed by deposition and diffusion techniques. In such transistors, majority charge carriers (electrons or holes) flow through the solid state semiconductor material from an electrode usually called the "source." The conductive path for these charge carriers, hereinafter called the "channel," is induced by an electric field and surface charges and occurs at surface and near-surface regions of the semiconductor body. In the absence of this induced channel, the flow of such charge carriers cannot occur. The charge carriers move or flow in the induced channel toward a second electrode called the "drain." Control (modulation) of the current flowing through this channel is achieved by means of a control or "gate" electrode. By this gate, the conductivity of the channel and hence the electron or hole current reaching the drain can be varied. This control electrode or "gate" is insulated from the semiconductor material to prevent the majority carriers from flowing to it and to prevent it from acting as a source or drain. Normally these devices are operated in a drain-voltage region where the drain current saturates or reaches a maximum, nearly constant value because the channel is pinched off or terminated very close to the drain region and acts as a current generator, the current being only a function of the gate voltage and not of the drain voltage. Thus, these devices basically exhibit a useful drain voltage-drain current characteristic similar to a vacuum pentode.

Such devices are known in the art and the structure and operation thereof have been amply described, especially by Hofstein and Heiman in an article entitled "Silicon Insulated-Gate Field-Effect Transistor" published in the September 1962 Proceedings of the I.E.E.E. commencing on page 1190. In one arrangement of such a field-effect transistor, the source and drain constitute spaced regions of like conductivity type disposed on the same surface of a semiconductor body with the gate arranged over the space between the source and drain regions and separated therefrom by an insulator. A typical prior art arrangement is shown in the above-mentioned article by Hofstein and Heiman. As noted, the gate electrode is insulated from the semiconductor material so that the gate electrode will not itself act as a source or drain electrode and may yet exert its control by field effect in the space between the source and drain electrodes.

It will be appreciated that it is highly desirable to precisely position the gate, which in prior art devices is generally of metal, over the space or channel region between the source and drain electrodes of the device. This permits the channel region between the source and drain to be completely modulated by the gate. If the gate is too wide relative to the channel region, undesirable and excessive stray capacitance is developed which reduces the frequency response of the device. If the gate is too small relative to the channel region and does not cover it in its entirety, undesirable ohmic and non-ohmic losses are introduced into the device and low transconductance may result. The mask alignment problems involved in prior devices having a small channel region are severe since an extremely narrow gate must be precisely fitted over the channel region. Often in such prior art devices some compromise was accepted and the gate electrode was intentionally permitted to overlap the drain electrode in order to relieve the mask alignment problem. As noted, this results in the introduction of an undesirable feedback capacitance usually referred to as Miller feedback capacitance.

In the copending application of R. W. Bower entitled "Field-Effect Device with Insulated Gate," Ser. No. 590,-033 filed Oct. 27, 1966, now Pat No. 3,472,712 and assigned to the instant assignee, a method for fabricating such devices is taught which overcomes the abovementioned difficulties by employing the process of ion implantation. According to the method described in this copending application a metallic gate member is positioned on an insulated surface portion of a semiconductor body and is then used as a mask against the implantation of conductivity-type-determining ions in the portion of the semiconductor body immediately beneath the gate, the ions however being implanted on either side of the gate to form source and drain regions spaced from each other by the channel-forming unimplanted region under the mask. An alternate technique is described in a continuation-in part application (Ser. No. 678,809 filed Nov. 30, 1967 by R. W. Bower and assigned to the instant assignee) of the aformentioned copending application is to first form spaced source and drain regions as by diffusion and then proceed to position the gate member on the space between these regions and employ ion implantation to provide extensions of these source and drain regions over to the masking gate member. In both cases the implanted ions are conductivity-type-determining ions and established source and drain regions or extensions thereof of opposite conductivity type with respect to the conductivity type of the semiconductor body, thus leaving a channel region between the source and drain regions and under the gate of the same type of conductivity as the semiconductor body. It will thus be appreciated that the conductivity-type-determining impurities introduced into the semiconductor body to form the source and drain regions or extensions thereof are ions of these impurities which directly enter the semiconductor body from an ion beam originated at an ion beam source. Hence, this implantation process is referred to as "direction implantation."

While the advantages of ion implantation over other processes such as diffusion for introducing conductivity-type-determining impurities into a semiconductor body are undeniable, there are some problems associated with direct ion implantation. For one thing the number of conductivity-type-determining impurities susceptible of ready ionization is relatively limited. Furthermore it is necessary to utilize separate ion sources in the ion implantation system for each kind of conductivity-type-determining impurity where it is desired to implant ions of more than one type of conductivity in a semiconductor body.

It is therefore an object of the invention to provide an improved method for fabricating field-effect devices.

It is an other object of the present invention to provide an improved method for making an insulated-gate field-effect device.

A further object of the invention is to provide an improved method for making a field-effect transistor of the insulated-gate type.

Another object of the invention is to provide an improved method for making a field-effect transistor of the insulated-gate type and characterized by low Miller feedback capacitance.

Still another object of the invention is to provide an improved method for making a field-effect transistor having a source-drain channel effectively controlled by an insulated-gate structure.

Yet another object of the invention is to provide an improved method for making a field-effect transistor in which an insulated gate is precisely located over the channel region between the source and drain regions thereof.

Still another object of the invention is to provide an improved method for locating an insulated gate over the channel region in a field-effect transistor which avoids critical and difficult gate alignment problems.

Yet another object of the invention is to provide an improved method for making a field-effect device of the insulated-gate type whereby the total gate capacitance may be reduced to only that useful in modulating the conductivity of the channel therein.

These and other objects and advantages of the instant invention are achieved by utilizing an indirect ion implantation process to form source and drain regions or portions thereof in a semiconductor body. Indirect ion implantation is a process wherein the conductivity-type-determining impurities are not ionized and then introduced into the semiconductor body as ionized atoms but are applied to the surface of the semiconductor as an impurity layer which is then irradiated with ions which may be electrically inert so that the impurity atoms are driven into the semiconductor body by a transfer of momentum from the bombarding ions. In one embodiment an insulated gate-member is first formed on the surface of the semiconductor body and then the impurity layer is applied to this surface and irradiated with ions to form the source and drain regions with the gate serving as a mask against indirect implantation. In another embodiment relatively widely spaced source and drain regions may first be formed as by diffusion after which the insulated gate member is disposed on the surface of the channel region between the source and the drain regions. In this embodiment the gate member is spaced from and is between the source and drain regions, thus leaving a gap or gate—uncovered portion of the channel region between the gate member and the source and drain regions. By leaving this gap, critical and difficult-to-achieve gate alignment problems are avoided. The gate itself is then used as a mask against indirect ion implantation as in the first embodiment to form relatively shallow, implanted extensions of the source and drain regions which terminate at the periphery of the gate member. Thus, by using the gate as a mask, the proper conductivity-type-determining impurities may be indirectly implanted into the semiconductor body adjacent the gate member so as to either form the source and drain members or to form extensions of already-formed source and drain regions, whereby the channel region is precisely positioned beneath the insulated-gate member.

In contrast to the diffusion techniques of the prior art for introducing such impurities into a semiconductor body which impurities diffuse into the body in at least two directions (i.e., vertically and laterally), ion-implanted impurities penetrate the body in only one direction (vertically). Hence, by the process of the invention, the impurities for forming or extending the source and drain regions in the semiconductor body do not spread laterally under the gate-mask member, thus permitting one to achieve a structure in which the gate is precisely positioned over the channel region between the source and drain regions, without any overlap whatsoever. In the embodiment where the major source and drain regions are first formed by diffusion one is able to more conveniently obtain source and drain regions of the requisite low resistivity than where the source and drain regions are provided solely by ion implantation. On the other hand critical gate alignment problems are avoided by using ion implantation to bridge these source and drain regions over to the gate.

The invention will be described in greater detail by reference to the drawings in which:

FIGS. 1(*a*) through 1(*d*) are cross-sectional elevational views of portions of an insulated-gate field-effect device in various stages of fabrication to form source and drain regions by indirect implanation according to the invention;

Figure 1A:
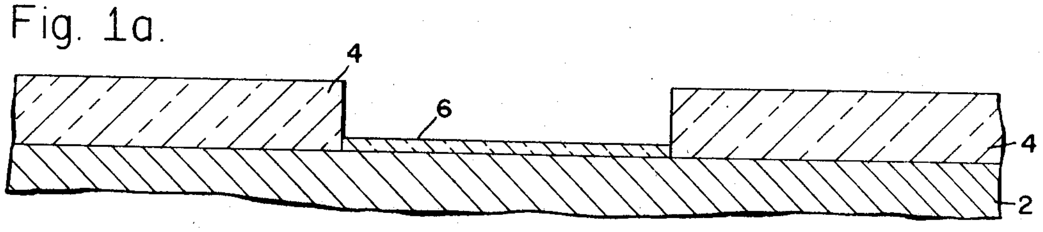
Figure 1B:
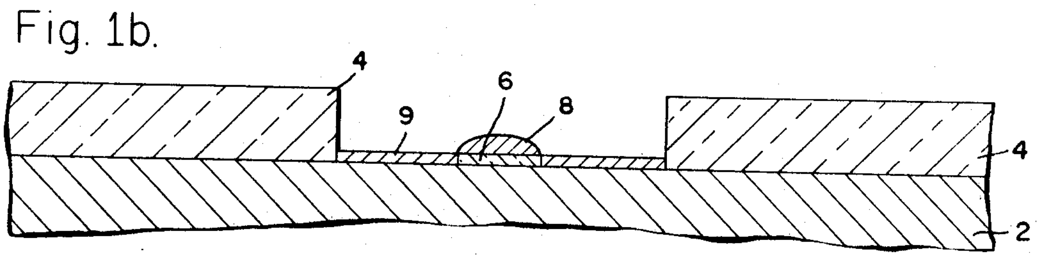
Figure 1C:
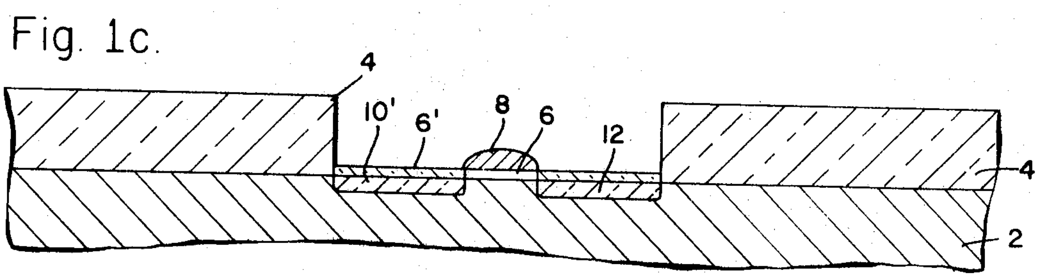
Figure 1D:
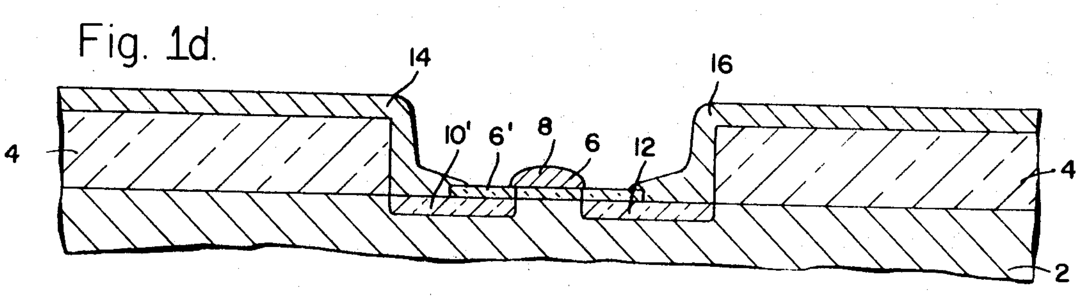

Before proceeding to a detailed description of the process of fabricating a device according to the invention, a brief explanation of ion implantation phenomena in general may be helpful. In fabricating semiconductor devices what is ultimately required is the incorporation of atoms capable of establishing a desired type of conductivity in a semi-conductor body. In the conventional diffusion process the atoms capable of establishing the requisite conductivity are in the vapor state and are not controllable except by thermodynamic techniques. In effect, the atoms in a diffusion process "drift" into contact with an exposed surface of a semiconductor body and continue to drift into the semiconductor body in a more or less random fashion in accordance with thermodynamic principles. In the direct ion implantation process, as explained in the aforementioned copending application, impurity atoms, which are otherwise of neutral charge or polarity, may be given a predetermined electrical charge or "ionized." Such charged atoms are therefore referred to as ions. By means of electric fields, these ions may then be formed in beams of various cross-sectional diameters and shapes and may also be caused to travel in predetermined directions at predetermined velocities much like the electrons in an electron beam. Therefore, instead of drifting into the lattice structure of a semiconductor body in random directions, these ions may be made to enter the lattice in a predetermined direction and may be positioned where desired therein. In addition, the concentration of such impurities in the semiconductor body may be readily controllable and may be made uniform or graded throughout the implanted region as desired. Thus in the direct ion implantation process atoms of a desired conductivity-type-determining impurity are ionized and made to enter a semiconductor body in a fixed and desired direction with little or no deviation therefrom and may be placed therein where desired to establish a region of given conductivity type of precise geometry and depth. In the indirect ion implantation process atoms of a desired conductivity-type-termining impurity atoms is in the form of a layer of impurity or dopant material applied on a surface of the semiconductor body and atoms of another material which may be electrically inert are ionized and caused to bombard preselected areas of the dopant layer. The collisions between these ions and the atoms of the impurity layer results in a transfer of momentum to the impurity atoms so that these impurity atoms are driven into the semiconductor body along with the ions to establish the desired type of conductivity therein. An "electrically inert" ion or atom is one which does not function as either an acceptor or a donor in a semiconductor body, and hence incorporation thereof in the semiconductor body does not contribute to or detrimentally affect current conduction therein. It will thus be appreciated that in indirect ion implanation the choice of conductivity-type-determining impurities is not limited to those capable of ready or convenient ionization but any of the known and conventionally used impurities may be used. Furthermore the ion source need only be capable of providing ions of one species; hence multiple ion sources for achieving the implanation of different conductivity-type-determining is not necessary. One of the important advantages of the process is the fact that the semiconductor body need not be heated to such elevated temperatures as necessary in other dopant processes which often deleteriously affect the semiconductor device and renders precise control of the fabrication thereof tedious and expensive.

Referring now to the drawings, the fabrication of a field-effect device will be described in connection with FIGS. 1(*a*) through 1(*d*). In FIG. 1(*a*) a portion of a semiconductor body 2, which examplarily may be of P-type silicon, is shown. An initial step in the fabrication of a device of this type may be the formation of a thick layer 4 of material on the surface of the semiconductor body 2 which layer is capable of preventing ions from reaching the underlying silicon body. A typical material for this purpose may be silicon oxide. Another suitable material is silicon nitride. The material constituting this layer 4 should be electrically insulating to obviate electrically shorting or otherwise adversely affecting the device in operation.

It will be appreciated that the velocity of the ions to be utilized and the depth of implantation desired will, in general, determine the minimum thickness of the mask layer 4. As a general rule, the thickness of the mask layer 4 should at least exceed the depth of ion penetration desired in the semiconductor body 2. Typically for penetration depths of from 0.2 to 0.6 micron, the layer 4 may be about 0.1 to 0.6 micron thick. It will also be appreciated that the requisite thickness of the mask layer 4 is also a function of the ion energy employed during irradiation. The exemplary thickness given for a mask of silicon dioxide is suitable for low energy ion implantation. In the case of high energy ion implantation, a silicon dioxide mask of about 1.0 micron in thickness is satisfactory. The mask layer 4 may be formed to the desired thickness simply by oxidizing surface portions of the semiconductor body 2 in accordance with teachings well known in the art.

The next step is to form a hole or opening in the mask layer 4 corresponding to the source-drain-gate regions to be formed in the semiconductor body 2 in side-by-side fashion. By photoresist and etching techniques, also well known in the art, a suitable opening may be formed as shown in FIG. 1(*a*). This step exposes the desired surface of the semiconductor body which surface is thereafter recovered with a thin layer 6 of electrically insulated material so as to permit a gate electrode member to be disposed thereon and electrically isolated from the semiconductor body 2. Typically, the thickness of the insulating layer 6 may be about 0.1 to 0.2 micron. A satisfactory material for the insulating layer 6 may again be silicon oxide conveniently formed by oxidizing the exposed surface of the silicon body 2. Silicon nitride may also be used for this purpose. It is also preferred to remove portions of this insulating layer 6 except under the gate electrode member 8 after the gate has been formed thereon so that the surface of the semiconductor body is exposed so that a layer of dopant material may be applied thereon.

The next step in the process is to form the gate itself at the desired location on the insulating layer 6. The gate may be of metal and of aluminum, for example. One method for forming the gate is to vapor-deposit metal entirely over the insulating layer 6 and then by photoresist and etching techniques remove the metal (and portions of the oxide layer 6) from unwanted areas to thereby leave the gate member 8 in place as shown in FIG. 1(*b*) and electrically insulated from the underlying semiconductor body by the insulating layer 6 remaining under the gate. Alternatively, the gate may be formed by vapor-depositing metal through a mask or template to the desired shape and position.

The assembly is now ready to have source and drain regions formed on either side of the gate 8 by indirect ion implantation with the gate acting as a mask or barrier against implantation in the portion of the semiconductor body 2 under the gate. To this end a layer 9 of a conductivity-type-determining material or dopant is applied over at least the exposed surface of the semiconductor body 2. Since it is desired to form source and drain regions of a conductivity-type opposite to that of the semiconductor body which is of P-type conductivity in the example under discussion, the dopant layer 9 may be of any suitable N-type impurity such as antimony, for example. The dopant layer 9 may be applied by any convenient technique, as by vapor-deposition, and not necessarily according to any particular pattern. Thus the dopant layer 9 may be applied so as to be disposed not only over the exposed semiconductor surface but also over the gate member 8 (as shown) and the adjoining oxide layer 4. The semiconductor body as shown in FIG. 1(*b*) is then placed into a suitable apparatus for forming and directing a beam of electrically inert ions toward the surface of the semiconductor body on which the gate-mask member 8 is disposed. The inert ions penetrate the dopant layer 9 and may themselves finally come to rest in the underlying semiconductor body except in regions under the thick masking layer 4 and the gate member 8. In penetrating the dopant layer 9 the inert ions collide with atoms of the material of this layer and transfer momentum thereto so as to drive these dopant atoms into the underlying semiconductor body, except in regions thereof under the gate 8 and the masking layer, which results in forming source and drain regions 10 and 12, respectively. Since the dopant atoms penetrate into the semiconductor body 2 in paths substantially perpendicular to the surface thereof, the perimeters of the implanted regions 10 and 12, constituting the source and drain portions of the device, respectively, are in substantially perfect alignment with the edges of the masking layer 4 and the mask gate member 8. Hence, the gate member 8 neither overlaps the source and drain regions 10 and 12 nor fails to cover the underlying unimplanted channel region 11 to any significant degree.

After the source and drain regions 10 and 12 have been thus formed, the dopant layer 9 covering the source and drain regions may be removed mechanically or chemically, as by chemical etching. A new layer 6' of electrically insulating material such as silicon oxide may be then formed on the surfaces of the source and drain regions 10 and 12 as by oxidizing these exposed surfaces. As shown in FIG. 1(*d*), metal (e.g., aluminum) may then be deposited on the surfaces of the source and drain regions exposed in openings provided in the oxide layer 6' and adjacent portions of the mask layer 4 to provide electrical contacts 14 and 16, respectively, to the source and drain regions. As shown, the contacts 14 and 16 do not have to be disposed entirely over the source and drain regions 10 and 12 but only to portions thereof. In addition, the metal deposited on the insulating layer 4 need only be of sufficient area to facilitate the making of electrical circuit connections thereto as by soldering, for example.

Figure 2:
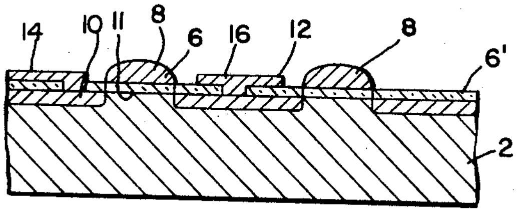
FIG. 2 is a perspective view, partly in section, of a completed insulated-gate field-effect device fabricated according to the invention.
Figure 3:
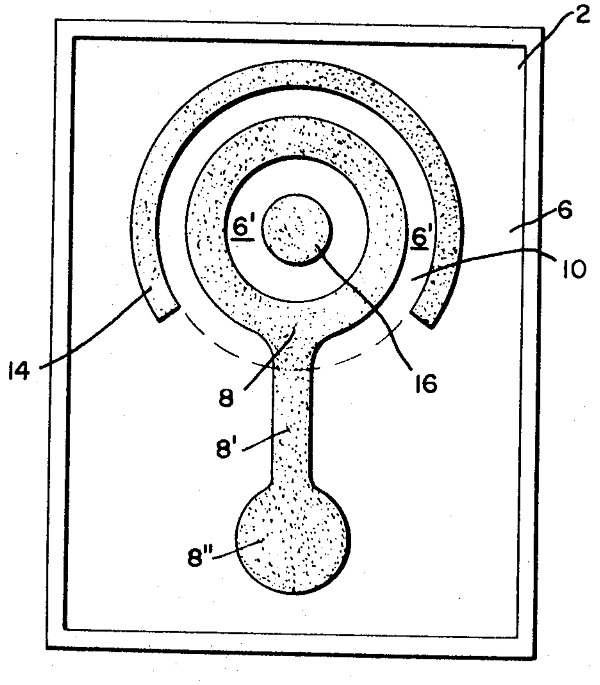
FIG. 3 is a plan view of the device shown in FIG. 2.

In FIGS. 2 and 3 a completed insulated-gate field-effect device is shown having an annular configuration. It is possible to eleminate use of the thick masking layer 4 which serves principally to limit the extent of the source region during fabrication. Thus, in the circular geometry device of FIGS. 2 and 3, the source region is allowed to extend outwardly for as far as desired simply by omitting the thick masking layer 4 thereover and subjecting the desired area to implantation. A thin insulating layer 6' may also be provided on the surfaces of the source and drain regions as mentioned previously to protect the same from adverse effects of the ambient. In the device shown in FIGS. 2 and 3 the source region 10 is of unrestricted extent. Thus the circular drain region 12 is surrounded by an annular channel region 11 which in turn is surrounded by a source region 10 which extends to the periphery of the semiconductor body, for example. Disposed on the drain region 12 is a drain contact member 16. The gate member 8 is provided with an extension 8' thereof which terminates in a relatively large area 8'' to facilitate the making of electrical circuit connections to the gate. A semi-annular or U-shaped contact member 14 is disposed on the source region 10. The remaining surface of the semiconductor body 2 may be covered with a protective film or layer 6 of insulating material such as silicon oxide, for example. Such an insulating film may also be disposed where necessary to achieve electrical isolation of contacts such as under the gate extension 8' and the connection pad 8'' therefor, for example.

Apparatus suitable for generating an ion beam for the purposes of the process of the invention is shown and described in the copending application, Ser. No. 640,441 entitled "Surface Ionization Apparatus," filed May 16, 1967, by R. G. Wilson et al. and assigned to the instant assignee. The apparatus comprises an ion beam source and is adapted to be disposed in an evacuated chamber (not shown) with the semiconductor body which it is desired to irradiate with ions. The semiconductor body will be positioned with respect to the ion source so as to be impinged by the ion beam emerging therefrom and accelerated by means of suitable electrodes. Typically satisfactory inert ion materials for use in the present invention are carbon, silicon or a noble gas such as helium, neon or krypton.

Figure 4A:
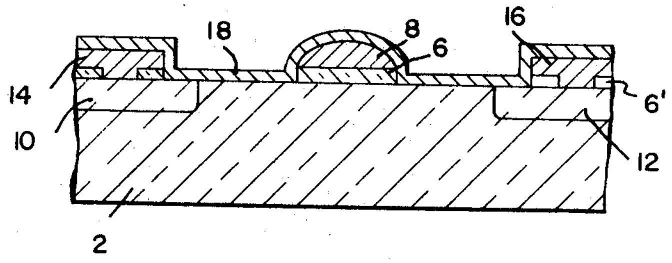
FIGS. 4A and 4B are cross-sectional elevational views of still another embodiment of an insulated-gate field effect device fabricated according to the invention and in which major source and drain regions are first formed as by diffusion and extended to the gate by indirect implanation.
Figure 4B:
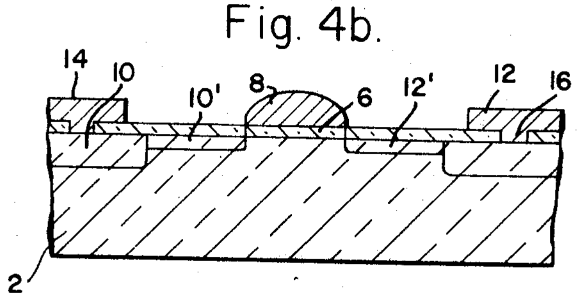

Referring now to FIGS. 4A and 4B, an embodiment is shown wherein the source and drain regions are formed only in part by implantation according to the techniques described herein. It has been found advantageous in some instances to form major portions of the source and drain regions 10 and 12 by diffusion in order to obtain regions of desirable low resistivity. Such low resistivity regions are very conveniently provided by the diffusion process and may be about 2 microns deep, for example. However, because of the fact that diffusion in a semiconductor body proceeds laterally as well as vertically into the crystal structure, sufficient space is left between the diffused source and drain regions 10 and 12 so that the diffusion cannot proceed laterally far enough to extend under the gate. As is well known in the art, the source and drain regions are formed by diffusing the appropriate conductivity-type-determining purity through an oxide mask which may be left in place. Contacts 14 and 16 may then be formed to the major source and drain regions 10 and 12 as described previously. Thereafter, the metal gate member 8 may be formed as described hereinbefore on the oxide layer 6 over the channel region and spaced from both the source and drain regions 10 and 12. The gate member 8 may advantageously be symmetrically positioned between the source and drain regions 10 and 12. A dopant layer 18 is then applied over the surface of the semiconductor body and at least over the channel region between the gate 8 and the source and drain regions 10 and 12. Thereafter, by using the gate 8 as mask against ion irradiation regions or extensions 10' and 12' respectively of the source and drain regions 10 and 12 may be formed. These regions or extensions 10' and 12' close up the gaps in the channel region between the gate member 8 and the diffused source and drain regions 10 and 12. In actual practice these extensions 10' and 12' are relatively shallow (e.g., 0.2 micron) relative to the diffused source and drain regions 10 and 12 and contact, respectively, the source and drain regions 10 and 12 on one side and extend toward each other, terminating at about the edge of the gate member 8. The termination of the source and drain extensions 10' and 12' is determined, of course, in accordance with or by the masking action of the gate member 8 against inert ion irradiation. The final step is to remove the dopant layer 18 leaving the structure shown in FIG. 4B.

There thus has been shown an improved method for making an insulated gate field effect device in which source and drain regions of desirable electric properties are provided in a structure in which the gate does not overlap either the source or drain thus avoiding such undesirable effects as Miller feedback capacitance and which structure permits fabrication without embodying critical and tedious gate alignment problems. In addition, the method of the invention permits one to utilize an ion implantation process with all the attendant advantages thereof while avoiding some of the limitations thereof such as a restricted choice of dopant impurities and the necessity of employing multiple ionization sources when one desires to dope a semiconductor body with more than just a single type of conductivity-type determining impurity or dopant.

What is claimed is:

1. The method of fabricating an insulated-gate field-effect device comprising the steps of:

(a) forming a layer of electrically insulating material on a portion of the surface of a semiconductor body;
(b) forming a gate electrode member on said layer of electrically insulating material;
(c) applying a layer of conductivity-type determining material at least on surface portions of said semiconductor body adjacent said insulated-gate electrode member;
(d) and causing ions of an electrically inert material to impinge on said layer, whereby atoms of said conductivity-type-determining material are driven in said semiconductor body in regions thereof adjacent the region under said gate electrode member.

2. The method of fabricating an insulated-gate field-effect device comprising the steps of:

(a) forming a layer of electrically insulating material on at least a portion of the surface of a semiconductor body having a first type of conductivity;
(b) forming a metallic gate electrode member on a portion of said layer of electrically insulating material;
(c) applying a layer of material, capable of establishing opposite conductivity to said first type, at least on surface portions of said semiconductor body adjacent said gate electrode member;
(d) and causing ions of an electrically inert material to impinge at least on preselected portions of said layer whereby regions of opposite conductivity type to that of said first type are established in said semiconductor body by atoms of the material of said layer which are driven into regions thereof which are adjacent the region thereof under said gate electrode member.

3. The method of fabricating an insulated-gate field-effect device comprising the steps of:

(a) forming a layer of silicon oxide on at least a portion of the surface of a silicon body having a first type of conductivity;
(b) forming a metallic gate electrode member on a portion of said layer of silicon oxide;
(c) applying a layer of material, capable of establishing opposite conductivity to said first type, at least on surface portions of said semiconductor body adjacent said gate electrode member;
(d) and causing ions of an electrically inert material to impinge on at least said layer, whereby said ions penetrate said layer and cause atoms of the material thereof to enter said silicon body and establish regions therein of opposite conductivity type to that of said first type adjacent the region of said silicon body under said gate electrode member.

4. The method of fabricating an insulated-gate field-effect device comprising the steps of:

(a) forming spaced source and drain regions of a first conductivity type in a semiconductor body of opposite conductivity type while leaving a channel region between said source and drain regions;
(b) forming an insulated-gate electrode member on a portion of the surface of said channel region and spaced from said source and drain regions;
(c) applying a layer of material, capable of establishing said first type of conductivity in a semiconductor body, on at least surface portions of said channel region between said insulated-gate electrode member and said source and drain regions;
(d) and causing ions of an electrically inert material to impinge on said layer between said insulated-gate electrode member and said source and drain regions whereby discrete regions of said first type of conductivity are established in said semiconductor body extending respectively from said insulated-gate electrode member to said source and drain regions.

5. The invention according to claim 4 wherein said source and drain regions are formed by diffusion.

6. The method of fabricating an insulated-gate field-effect device comprising the steps of:

(a) diffusing spaced source and drain regions of a first conductivity-type in a semiconductor body of opposite conductivity-type while leaving a channel region between said source and drain regions, said source, drain and channel regions having surfaces disposed on a common surface of said semiconductor body;
(b) forming an insulating layer at least on said surface of said channel region;
(c) forming a gate electrode member on a portion less than the whole of said insulating layer on said channel region and spaced from said source and drain regions;
(d) applying a layer of material, capable of establishing said first type of conductivity in a semiconductor body, at least on surface portions of said channel region between said gate electrode member and said source and drain regions;
(e) irradiating said layer with ions of an electrically inert material to thereby form discrete shallow surface and near-surface regions of said first type of conductivity in said channel region extending respectively from said gate electrode member to said source and drain regions.

References Cited

UNITED STATES PATENTS

| | | | |
|---|---|---|---|
| 2,735,948 | 2/1956 | Sziklai. | |
| 2,989,385 | 6/1961 | Gianola et al. | |
| 3,200,019 | 8/1965 | Scott et al. | 29—578 |
| 3,351,503 | 11/1967 | Fotland | 148—188 |
| 3,388,009 | 6/1968 | King | 317—235 |
| 3,413,531 | 11/1968 | Leith | 317—235 |

PAUL M. COHEN, Primary Examiner

U.S. Cl. X.R.

29—584, 590